US008853718B2

(12) United States Patent
Lee et al.

(10) Patent No.: US 8,853,718 B2
(45) Date of Patent: Oct. 7, 2014

(54) DISPLAY DEVICE WITH REINFORCED POWER LINES

(75) Inventors: Jaehyuk Lee, Paju-si (KR); Myungseop Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 134 days.

(21) Appl. No.: 13/408,954

(22) Filed: Feb. 29, 2012

(65) Prior Publication Data
US 2013/0037835 A1  Feb. 14, 2013

(30) Foreign Application Priority Data
Aug. 12, 2011  (KR) .................. 10-2011-0080599

(51) Int. Cl.
*H01L 29/205* (2006.01)
*H01L 51/52* (2006.01)
*H01L 27/32* (2006.01)

(52) U.S. Cl.
CPC ........ *H01L 27/3279* (2013.01); *H01L 51/5253* (2013.01)
USPC .............. 257/91; 257/E33.059; 257/E33.066; 257/40; 438/28; 438/533

(58) Field of Classification Search
CPC ...... G09G 2320/00; G09G 3/00; H01L 27/00; H01L 51/00; H01L 21/00; H01L 23/00
USPC .......................................... 345/92
See application file for complete search history.

(56) References Cited

U.S. PATENT DOCUMENTS

| 7,889,302 | B2 * | 2/2011 | Kim .............................. 349/139 |
| 2004/0227159 | A1 | 11/2004 | Nakashima et al. |
| 2007/0075955 | A1 * | 4/2007 | Jung et al. ........................ 345/92 |
| 2009/0261713 | A1 * | 10/2009 | Choi et al. .................... 313/504 |
| 2010/0006866 | A1 * | 1/2010 | Koyama ........................... 257/88 |
| 2011/0210335 | A1 * | 9/2011 | Miyagi et al. ................... 257/59 |
| 2012/0001156 | A1 * | 1/2012 | Cho et al. ........................ 257/40 |

FOREIGN PATENT DOCUMENTS

| KR | 10-2011-0064671 A | 6/2011 |
| KR | 10-2011-0065777 A | 6/2011 |

OTHER PUBLICATIONS

German Patent and Trademark Office, Office Action, German Patent Application No. 10 2012 203 530.3, Jun. 5, 2014, eleven pages.
Korean Intellectual Property Office, Office Action, Korean Patent Application No. 10-2011-0080599, Jun. 18, 2014, five pages [with concise explanation of relevance in English].

* cited by examiner

*Primary Examiner* — Telly Green
(74) *Attorney, Agent, or Firm* — Fenwick & West LLP

(57) ABSTRACT

A display device is provided with a reinforced power line. The display device includes a common power line. A light emission layer is interposed between a first and a second electrode. A passivation layer is formed over the second electrode and has a stepped shape. An auxiliary metal layer is coupled to a common power line. At least a portion of the auxiliary metal layer is formed over the passivation layer and has a shape that follows the stepped shape of the passivation layer.

24 Claims, 7 Drawing Sheets

DISPLAY DEVICE WITH REINFORCED POWER LINES

CROSS-REFERENCE TO RELATED APPLICATIONS

This application claims the benefit of Korea Patent Application No. 10-2011-0080599 filed on Aug. 12, 2011, which is hereby incorporated by reference in its entirety.

BACKGROUND

1. Field of the Disclosure

The present disclosure relates to a display device, and more particularly, to a display device capable of preventing luminance variance and preventing increased power consumption caused by its large size.

2. Related Art

Recently, a variety of flat panel displays capable of overcoming shortcomings of considerable weight and volume of a cathode ray tube (CRT) have been developed. Example of flat panel displays include a liquid crystal display (LCD), a plasma display panel (PDP), an organic light emitting diode (OLED) display, etc.

The OLED display is a self-emitting display which electrically excites an organic compound so as to emit light. The OLED display can be implemented in a compact structure that simplifies its manufacturing process since it does not require a backlight. In addition, the OLED display has advantages of a low-temperature manufacturing process, a high response speed of less than 1 ms, low power consumption, a wide viewing angle, a high contrast, etc.

The OLED display includes an emission layer formed of an organic material between an anode and a cathode. The emission layer emits light by energy generated when excitons, which are hole-electron pairs generated from recombination of holes supplied from the anode and electrons supplied from the cathodes in the emission layer, are dropped to the ground state.

Referring to FIG. 1, illustrated is a cross-sectional view of a conventional OLED display 10. The conventional OLED display 10 includes a thin film transistor TFT and a capacitor Cst formed on a substrate 12, an insulating layer insulating the thin film transistor TFT, the capacitor Cst and a common power line 14, and a first electrode 18 formed on the insulating layer 16 and coupled to the thin film transistor TFT. In addition, the OLED display 10 includes a bank layer 20 formed on the first electrode 18, an organic emission layer 22 formed on a portion of the first electrode 18, exposed by the bank layer 20, and a second electrode 24 formed on the organic emission layer 22.

The OLED display 10 further includes an auxiliary metal layer 28 formed on and attached to a counter substrate 26 to reduce the resistance of the common power line 14. The two substrates 12 and 26 are effectively bonded to each other using a sealant 32. Here, the auxiliary metal layer 28 and the common power line 14 are not directly connected, but are instead electrically coupled to each other through an Ag dot 30.

There have been several issues with the conventional OLED display 10 of FIG. 1. First, the process of forming an auxiliary metal layer 28 that is attached to the upper substrate 26 reduces production yield. Second, an alignment process for forming the Ag dot 30 to connect the auxiliary metal layer 28 and the common power line 14 to each other requires high accuracy and may cause poor contact between the common power line 14 and the auxiliary metal layer 28.

SUMMARY

Accordingly, one object of the present disclosure is to provide a display device including an auxiliary metal layer formed on a substrate on which a common power line is formed on and directly connected with the common power line so as to prevent poor contact of the common power line and the auxiliary metal layer and to reduce the resistance of the common power line.

In one embodiment, a display device comprises a common power line. A light emission layer is interposed between a first and a second electrode. A passivation layer is formed over the second electrode and has a stepped shape. An auxiliary metal layer is coupled to the common power line. At least a portion of the auxiliary metal layer is formed over the passivation layer and has a shape that follows the stepped shape of the passivation layer.

In some embodiments, a polymer is located between the auxiliary metal layer and the electrode and protects the display device from contaminants. The polymer may entirely cover the light emission material or have an opening that overlaps with the light emission material.

In one embodiment, a method of fabricating the display device is provided. A common power line is formed. A first electrode is formed, a light emission layer is formed over the first electrode, and a second electrode is formed over the light emission layer. A passivation layer is formed over the second electrode, the passivation layer having a stepped shape. An auxiliary metal layer is formed that is coupled to the common power line. At least a portion of the auxiliary metal layer is formed over the passivation layer and has a shape that follows the stepped shape of the passivation layer.

BRIEF DESCRIPTION OF THE DRAWINGS

The accompanying drawings, which are included to provide a further understanding of the disclosed embodiments and are incorporated in and constitute a part of this application, illustrate embodiment(s) of the present disclosure and together with the description serve to explain the principles of the disclosed embodiments. In the drawings.

DETAILED DESCRIPTION

Reference will now be made in detail to various embodiments of the present disclosure, examples of which are illustrated in the accompanying drawings. In the present disclosure, it will be understood that when an element, such as a substrate, a layer, a region, a film, or an electrode, is referred to as being formed "on" or "over" another element in the various embodiments described herein, the element may be directly on or over the other element, or intervening elements (indirectly) may be present.

Figure 1:
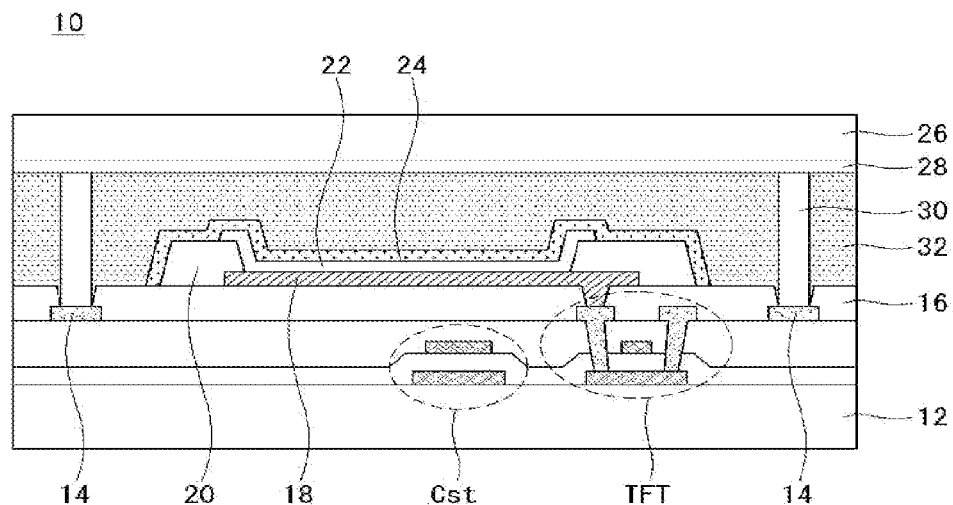
FIG. 1 is a cross-sectional view of a conventional OLED display.
Figure 2:
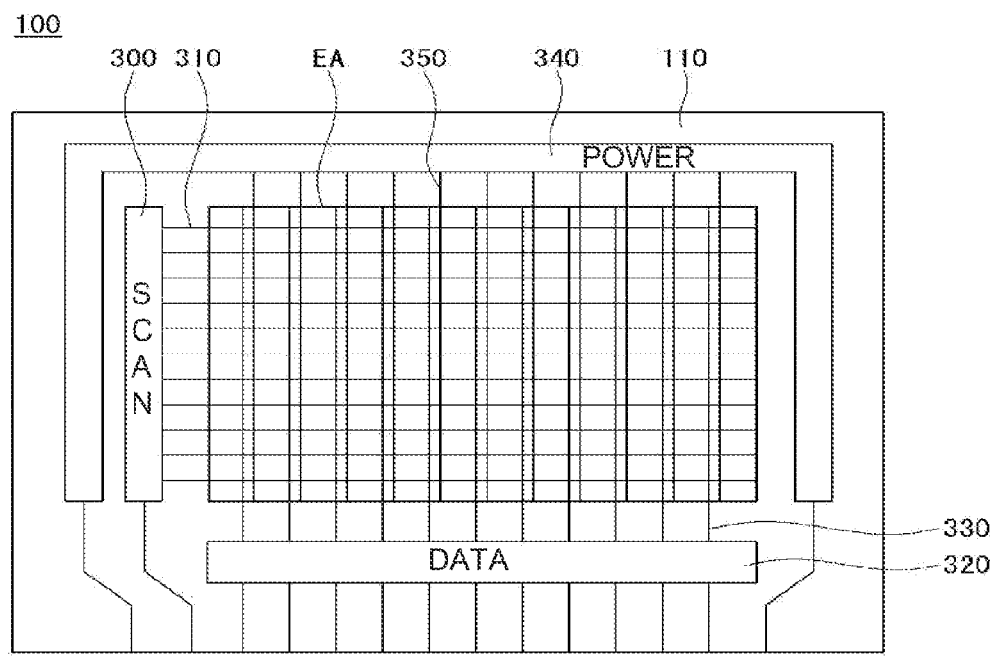
FIG. 2 is a plan view of a display device according to an embodiment.
Figure 3:
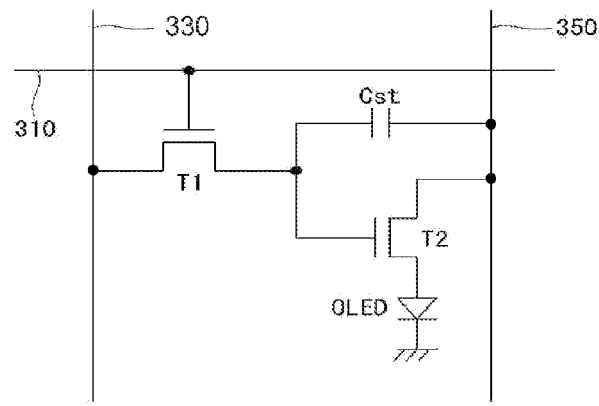
FIG. 3 is a circuit diagram showing a sub-pixel of the display device according to an embodiment.

FIG. 2 is a plan view of a display device 100 according to an embodiment and FIG. 3 is a circuit diagram showing a sub-pixel of the display device 100 according to an embodiment.

Referring to FIG. 2, the display device 100 includes an emission area EA formed on a substrate 110. The display device 100 displays an image through the emission area EA. A scan driver 300 for supplying a scan signal through a scan line 310 is arranged on one side of the emission area EA and a data driver 320 for supplying a data signal through a data line 330 is located under the emission area EA. In addition, a common power line 340 for providing a power supply voltage through a power line 350 is arranged around three sides of the emission area EA. The common power line 340 may provide a common power supply voltage to many pixels of the display device through power lines 350.

The display device 100 generates an image in the emission area EA according to intersection of the scan line 310, the data line 330 and the power line 350. The shapes and locations of the scan driver 300, the data driver 320 and the common power line 340 are exemplary in the current embodiment, and thus the disclosed embodiments are not limited thereto and they can have various shapes and locations.

While the display device 100 is an exemplary OLED display including a plurality of sub-pixels, one sub-pixel is described below as an example for convenience of explanation.

Referring to FIG. 3, the sub-pixel of the OLED display according to one embodiment may include a switching thin film transistor T1 which transfers a data signal of the data line 330 according to a scan signal from the scan line 310, a capacitor Cst which stores the data signal, a driving thin film transistor T2 which generates a driving current corresponding to a difference between the data signal stored in the capacitor Cst and a power voltage of the power line 350, and an OLED emitting light corresponding to the driving current. While a 2T1C structure including two thin film transistors and one capacitor is described in the current embodiment, the disclosed embodiments are not limited thereto.

Figure 4:
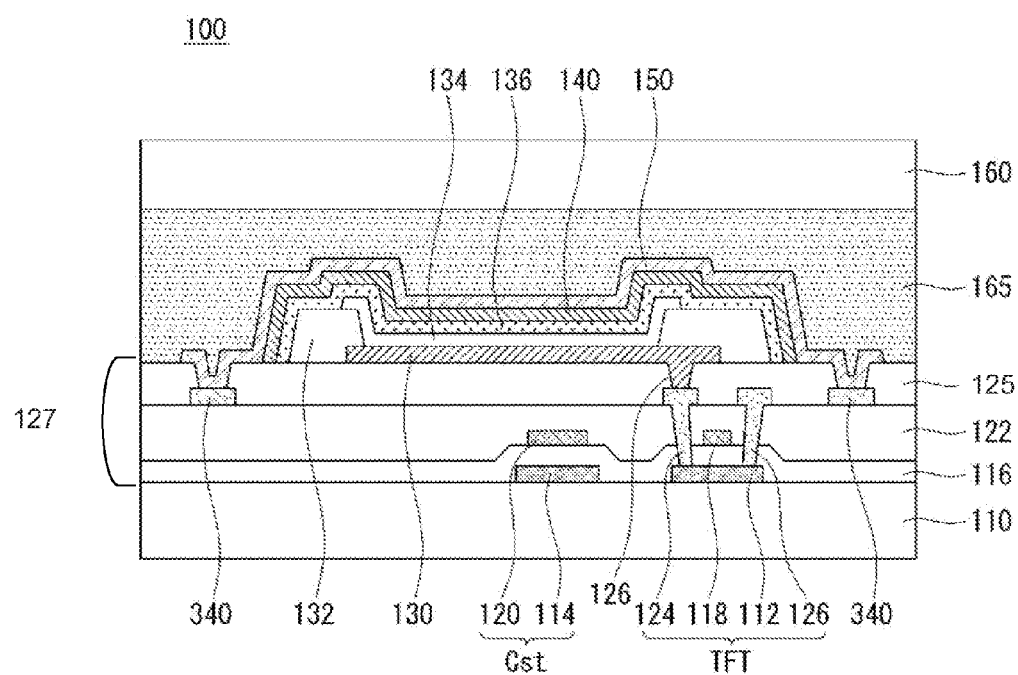
FIGS. 4 through 6 are cross-sectional views showing a display device according to a first embodiment.
Figure 5:
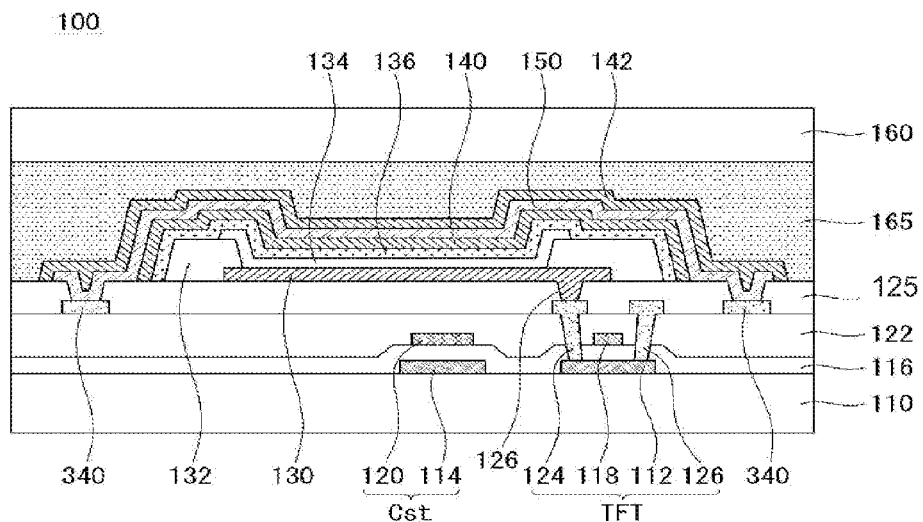
Figure 6:
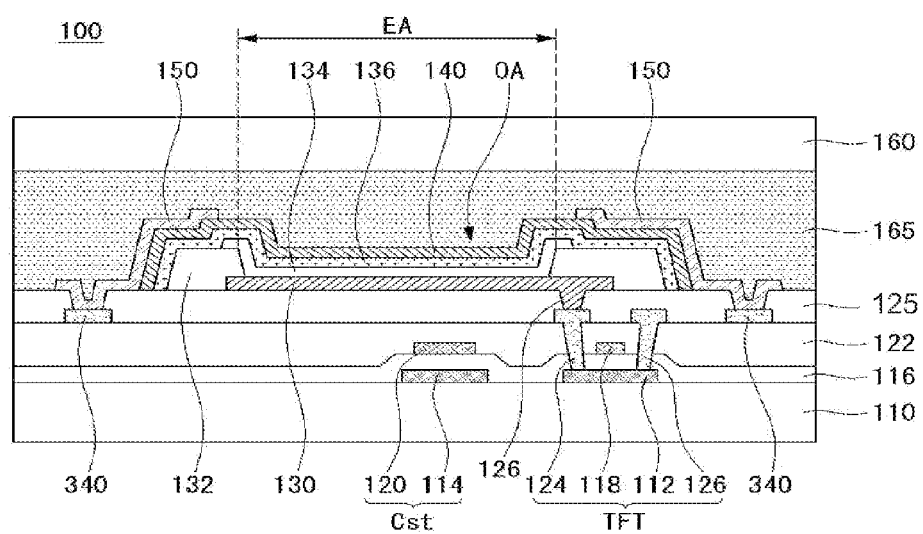
Figure 7:
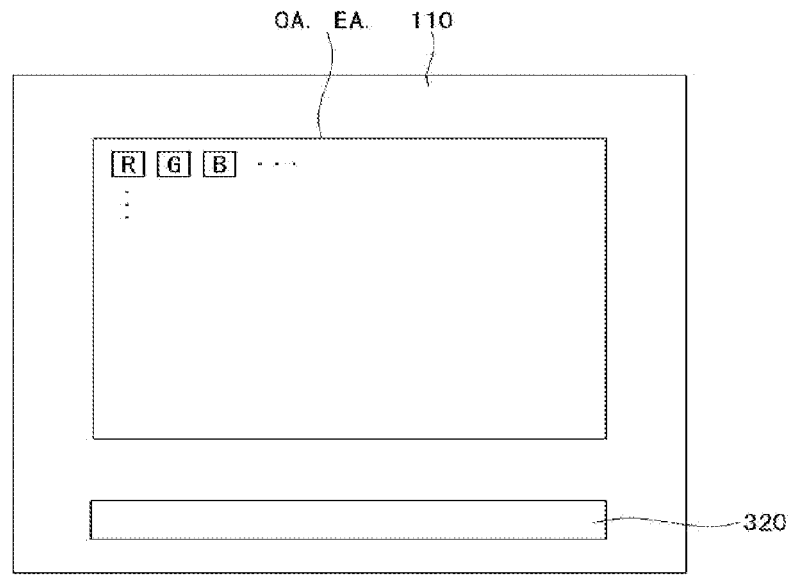
FIG. 7 is a plan view of the display device shown in FIG. 6 according to the first embodiment.

FIGS. 4 through 6 are cross-sectional views showing a display device 100 according to first embodiments. FIG. 7 is a plan view of the display device according to the first embodiment shown in FIG. 6.

Referring to FIG. 4, the display device 100 includes a substrate 110, a first electrode 130 and a second electrode 136 disposed on the substrate 110. The display device 100 includes an organic emission layer 134 interposed between the first electrode 130 and the second electrode 136. The display device further includes a common power line 340 located on the substrate 110 and disposed around elements such as the first electrode 130, second electrode 136, and organic emission layer 134. The display device also includes a first passivation layer 140 located on the second electrode 136, and an auxiliary metal layer 150 which covers the first passivation layer 140 with step coverage and is coupled to the common power line 340. Several of the layers have a stepped shape, which results in the layers being non-planar, i.e., for a given layer, some portions of the layer are further from the substrate 110 than other portions of the layer.

More specifically, a thin film transistor TFT and a capacitor Cst are arranged on the substrate 110. The thin film transistor TFT includes a semiconductor layer 112, a gate electrode 118, and source/drain electrodes 126 and 124. A gate insulating layer 116 is interposed between the semiconductor layer 112 and the gate electrode 118 and an interlayer insulating layer 122 is formed between the gate electrode 118 and the source/drain electrodes 126 and 124. The capacitor Cst includes a capacitor lower electrode 114 and a capacitor upper electrode 120 having the gate insulating layer 116 interposed between them.

While a top-gate type thin film transistor in which the gate electrode 118 is located over the semiconductor layer 112 is described in the first embodiments, the disclosed embodiments are not limited thereto. In other embodiments, the transistor TFT may be a bottom-gate type thin film transistor in which the gate electrode 118 is located under the semiconductor layer 112. Collectively, the gate insulating layer 116, interlayer insulating layer 122, overcoat film 125 layer, and any other layers in which a TFT is formed can be viewed as a TFT layer 127.

The common power line 340 may be formed in the TFT layer 127. Specifically, the common power line 340 may be formed on the same level as the source/drain electrodes 126 and 124 of the thin film transistor TFT. The common power line 340 surrounds the emission area EA shown in FIG. 2 and is formed of the same material as the source/drain electrodes 126 and 124. While the common power line 340 is formed of the same material as the source/drain electrodes 126 and 124 on the same level as the source/drain electrodes 126 and 124 in the first embodiments, in other embodiments the common power line 340 can be formed of the same material as the gate electrode 118 on the same level as the gate electrode 118.

An overcoat film 125 is disposed on the substrate 110 on which the thin film transistor TFT, the capacitor Cst and the common power line 340 are formed. The overcoat film 125 protects the thin film transistor TFT and the capacitor Cst and planarizes stepped portions caused by the thin film transistor TFT.

The first electrode 130 is located on the overcoat film 125. The first electrode 130 corresponds to an anode and may be formed of a transparent conductive material having a high work function, such as Indium Tin Oxide (ITO), Indium Zinc Oxide (IZO), Indium Cerium Oxide (ICO), or Zinc Oxide (ZnO). Part of the first electrode 130 penetrates the overcoat film 125 to be electrically coupled to the drain electrode 124 of the thin film transistor TFT through a via-hole 126 which exposes the drain electrode 124 of the thin film transistor TFT.

A bank layer 132 is disposed on the first electrode 130. The bank layer 132 may be a pixel-defining layer which selectively exposes the first electrode 130 to define a pixel. The organic emission layer 134 is located on the bank layer 132 and the exposed portion of the first electrode 130. The organic emission layer 134 can be viewed as a light emission layer that emits light according to recombination of holes and electrodes. A hole injection layer or a hole transport layer may be interposed between the organic emission layer 134 and the first electrode 130 or may be disposed on the organic emission layer 134.

The second electrode 136 is located on the substrate 110 on which the organic emission layer 134 is formed. The second electrode 136 is a cathode which may be formed of magnesium (Mg), calcium (Ca), aluminum (Al), silver (Ag), or an alloy of them.

The display device 100 according to the first embodiments may be a bottom emitting display device which emits light from the organic emission layer 134 toward the substrate 110.

The display device 100 may also be a top emitting display device which emits light from the organic emission layer 134 toward the second electrode 136. In the bottom emitting display device, the first electrode 130 is formed such that it transmits light and the second electrode 136 is formed thick enough to reflect light. Conversely, in the top emitting display device, the first electrode 130 may further include a reflecting layer formed of one of aluminum (Al), silver (Ag) and nickel (Ni) therebelow and the second electrode 136 is formed thin enough to transmit light. The second electrode 136 is preferably 1 Angstrom (Å) to 50 Å thick.

The first passivation layer 140 is located on the substrate 110 on which the second electrode 136 is formed to cover the second electrode 136 and to follow the surface shape of the second electrode 136. In other words, the first passivation layer 140 has a stepped shape and is formed to cover the second electrode 136 with step coverage. The first passivation layer 140 is a shielding layer that protects elements formed therebelow and prevents the organic emission layer 134 from being contaminated by moisture. The first passivation layer 140 may be formed from a single layer of silicon oxide or silicon nitride, or multiple layers thereof.

The auxiliary metal layer 150 is disposed on the first passivation layer 140. The auxiliary metal layer 150 is used to reduce the resistance of the common power line 340 by providing additional metal through which power can be carried. When the display 100 is large, the resistance of the common power line 340 becomes non-trivial and results in a significant amount of power loss across the power line 340. The auxiliary metal layer 150 reduces the resistance of the common power line 340 and thus decreases the power lost across the common power line 340. In other words, the additional metal of auxiliary metal layer 150 reinforces the power line 340.

The auxiliary metal layer 150 is formed on top of the first passivation layer 140 to cover the first passivation layer 140 with step coverage and is coupled to the common power line 340. The auxiliary metal layer 150 has a stepped shape that follows the stepped shape of the underlying passivation layer 140. The auxiliary metal layer 150 may be directly coupled to the common power line 340 without any intervening material. Forming the auxiliary metal layer 150 on the same substrate 12 as the power line 340 and directly connecting the metal layer 150 to the common power line 340 is beneficial, among other reasons, for simplifying the manufacturing process and improving production yield.

The auxiliary metal layer 150 may be formed from a single layer of magnesium (Mg), aluminum (Al), silver (Ag), copper (Cu), titanium (Ti), molybdenum (Mo), tungsten (W), neodymium (Nd) and ytterbium (Yb). The auxiliary metal layer 150 may also be formed from multiple layers of or an alloy of any of these elements.

When the display device 100 is a bottom emission type display device, the auxiliary metal layer 150 may be 1000 to 8000 Å thick. It is advantageous if the auxiliary metal layer 150 has a thickness of 1000 Å or more in that the resistance of the common power line 340 can be reduced. It is also advantageous if the auxiliary metal layer 150 has a thickness of 8000 Å or less in that deterioration of the organic emission layer 134 during a process of forming the auxiliary metal layer 150 can be prevented. When the display device 100 of the present invention is a top emission type display device, the auxiliary metal layer 150 is thin enough to be substantially transparent in order to transmit light emitted from the organic emission layer 134. For top emission type display devices, the auxiliary metal layer 150 is preferably 1 to 200 Å thick.

The overcoat film 125 that covers the common power line 340 is selectively etched to expose the common power line 340, and the auxiliary metal layer 150 is coupled to the exposed portion of the common power line 340.

A sealing substrate 160 is effectively bonded to the substrate 110 on which the auxiliary metal layer 150 is formed using a sealant 165. The sealant 165 bonds the substrate 110 and the sealing substrate 160 to each other and covers all the internal elements of the display device to protect them. A material having excellent adhesion property and high transmissivity can be used as the sealant 165. For example, the sealant 165 can be made of a thermosetting or photocurable material, such as epoxy, acryl, imide, or silane.

As shown in FIG. 5, the display device 100 according to the first embodiments may further include a second passivation layer 142 formed on the auxiliary metal layer 150. The second passivation layer 142 is formed of the same material as the first passivation layer 140 so as to protect the auxiliary metal layer 150 formed therebelow and prevent the auxiliary metal layer 150 from being infiltrated by oxygen and moisture.

Referring to FIGS. 6 and 7, the display device 100 according to the first embodiment of the present invention may further include an opening area OA in the auxiliary metal layer 150, which corresponds to the emission area EA and overlaps with at least a portion of the elements in the emission area EA, such as the first electrode 130, organic emission material 134, and second electrode 136. The emission area EA includes R, G and B sub-pixels which emit light from the organic emission layer 134 to display an image. The opening area OA formed in the auxiliary metal layer 150 prevents the display device 100 from malfunctioning when a short circuit is generated in the emission area EA due to particles. Furthermore, the opening area OA formed in the auxiliary metal layer 150 corresponds to the emission area EA of sub-pixels so as to prevent deterioration of emission efficiency without decreasing transmissivity in a top emitting type display device.

As described above, the disclosed display device can prevent poor contact of the common power line and the auxiliary metal layer by forming the auxiliary metal layer on the substrate on which the common power line is disposed to directly connect the common power line to the auxiliary metal layer. Forming the auxiliary metal layer on the same substrate as the common power line also improves production yield by simplifying the auxiliary metal layer manufacturing process. In addition, at least one passivation layer and auxiliary metal layer can be formed on the second electrode to enhance encapsulation effect.

Figure 8:
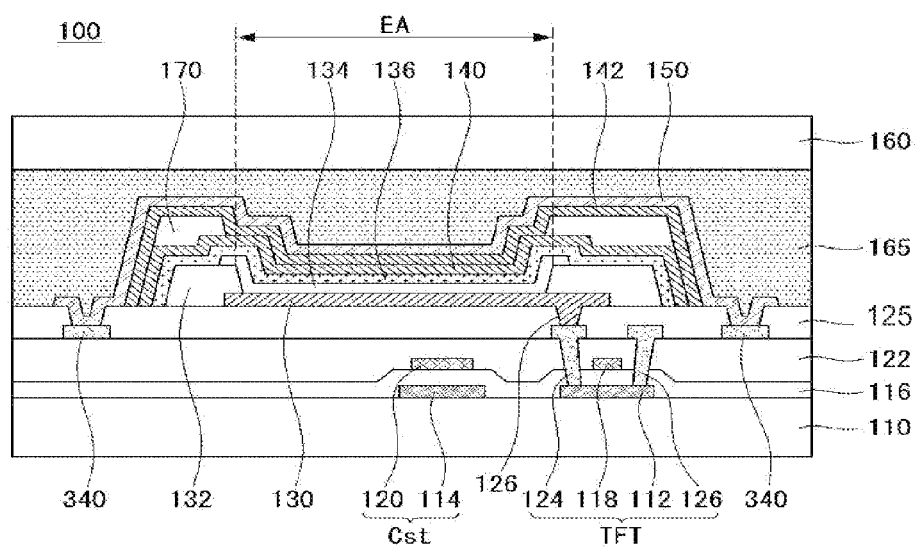
FIG. 8 is a cross-sectional view of a display device according to a second embodiment.
Figure 9:
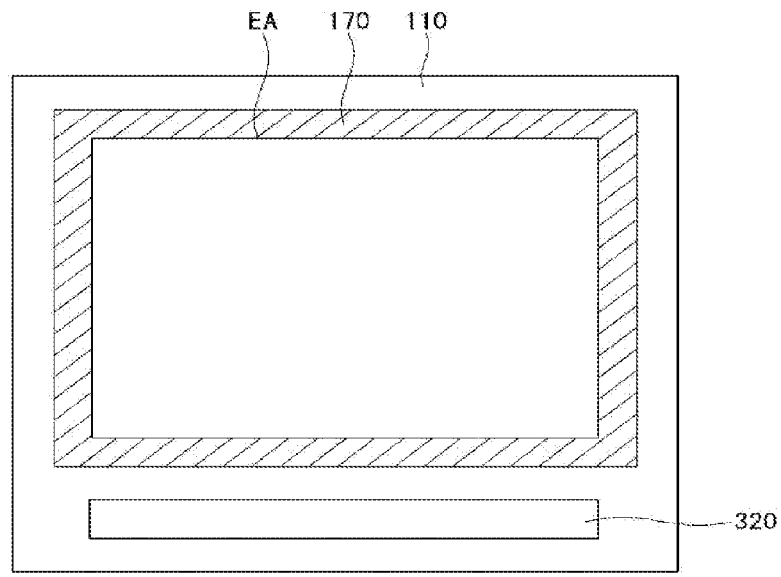
FIG. 9 is a plan view of the display device shown in FIG. 8 according to the second embodiment.
Figure 10:
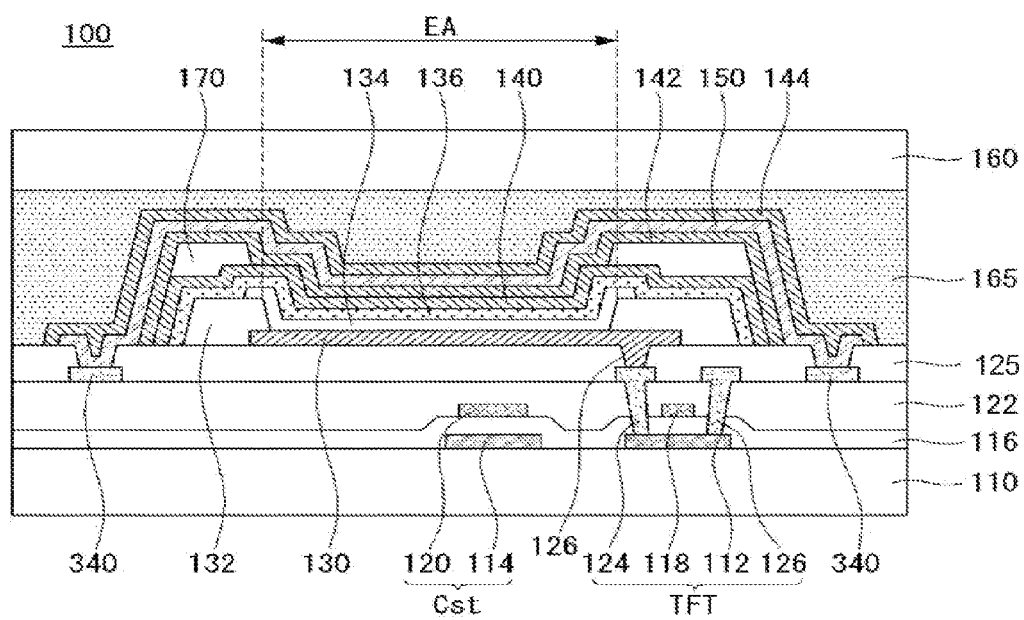
FIGS. 10 through 12 are cross-sectional views showing the display device according to the second embodiment.
Figure 11:
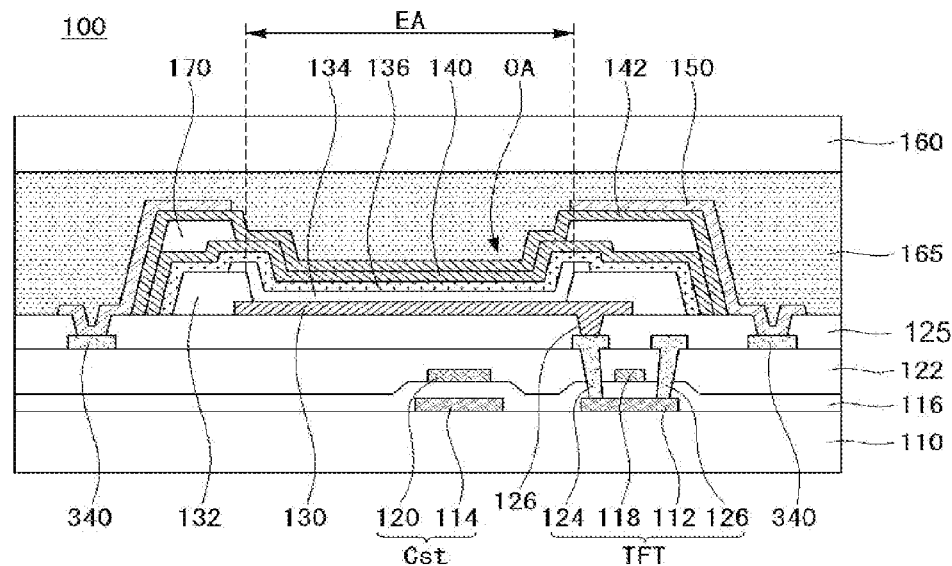

FIGS. 8, 10 and 11 are cross-sectional views showing a display device 100 according to second embodiments. FIG. 9 is a plan view of the display device shown in FIG. 8. The same reference numbers will be used throughout this specification to refer to the same or like parts.

Referring to FIG. 8, the display device 100 according to a second embodiment includes a substrate 110, a first electrode 130 and a second electrode 136 located on the substrate 110, an organic emission layer 134 interposed between the first electrode 130 and the second electrode 136, the common power line 340 located on the substrate 110 and disposed around the second electrode 136, a first passivation layer 140 located on the second electrode 136, a polymer layer 170 disposed on the first passivation layer 140, a second passivation layer 142 located on the polymer layer 170, and an auxiliary metal layer 150 which covers the second passivation layer 140 with step coverage and is coupled to the common power line 340.

More specifically, a thin film transistor TFT and a capacitor Cst are arranged on the substrate 110 as in the first embodiments. The thin film transistor TFT includes a semiconductor layer 112, a gate electrode 118, and source/drain electrodes 126 and 124. A gate insulating layer is interposed between the semiconductor layer 112 and the gate electrode 118 and an interlayer insulating layer 122 is formed between the gate electrode 118 and the source/drain electrodes 126 and 124. The capacitor Cst includes a capacitor lower electrode 114 and a capacitor upper electrode 120 having the gate insulating layer 116 interposed between them.

The common power line 340 is formed on the same level as the source/drain electrodes 126 and 124 of the thin film transistor TFT and an overcoat film 125 is disposed on the substrate 110 on which the thin film transistor TFT, the capacitor Cst and the common power line 340 are formed. The first electrode 130 is located on the overcoat film 125, and the bank layer 132 is disposed on the first electrode 130. The organic emission layer is disposed on the bank layer 132 and an exposed portion of the first electrode 130 and the second electrode 136 is arranged on the substrate 110 on which the organic emission layer 134 is formed. The first passivation layer 140 is formed on the substrate 110 on which the second electrode 136 is formed to cover the first passivation layer 140 with step coverage.

Referring to FIGS. 8 and 9, in the second embodiments, a polymer layer 170 is formed on the first passivation layer 140. The polymer layer 170 is located around the emission area EA and surrounds the emission area EA. An opening in the polymer layer 170 overlaps with at least a portion of the elements in the emission area EA, such as the first electrode 130, organic emission material 134, and second electrode 136. The polymer layer 170 may be made of a liquid, such as an acrylic resin, siloxane resin, urethane resin, or the like. The polymer layer 170 fills a gap formed in an inorganic layer (e.g., the first passivation layer 140 and the second electrode 136) below the polymer layer 170 due to contaminants, and thereby prevents external moisture and oxygen from infiltrating into the emission area EA through the gap.

The second passivation layer 142 is formed on and covers the polymer layer 170 and the first passivation layer 140. The second passivation layer 142 is formed of the same material as the first passivation layer 140. The auxiliary metal layer 150 is disposed on the second passivation layer 142. The auxiliary metal layer 150 is used to reduce the resistance of the common power line 340 as in the first embodiment. The auxiliary metal layer 150 is formed on the second passivation layer 142 to cover the second passivation layer 142 with step coverage and coupled to the common power line 340. The overcoat film 125 covering the common power line 340 is selectively etched to expose the common power line 340, and the auxiliary metal layer 150 is coupled to the exposed portion of the common power line 340. A sealing substrate 160 is effectively bonded to the substrate 110 on which the auxiliary metal layer 150 is formed using a sealant 165.

As shown in FIG. 10, the display device 100 according to a second embodiment may further include a third passivation layer 144 formed on the auxiliary metal layer 150. The third passivation layer 144 is formed of the same material as the first and second passivation layers 140 and 142, protects the auxiliary metal layer 150 formed therebelow, and prevents external moisture and oxygen from infiltrating into the auxiliary metal layer 150.

As shown in FIG. 11, the display device 100 according to a second embodiment may further include an opening area OA in the auxiliary metal layer 150, which corresponds to the emission area EA. The emission area EA includes R, G and B sub-pixels which emit light from the organic emission layer 134 to display an image. The opening area OA formed in the auxiliary metal layer 150 prevents the display device from malfunctioning when a short circuit is generated in the emission area EA due to particles. Furthermore, the opening area OA formed in the auxiliary metal layer 150 corresponds to the emission area EA of sub-pixels so as to prevent deterioration of emission efficiency without decreasing transmissivity in a top emitting type display device.

Figure 12:
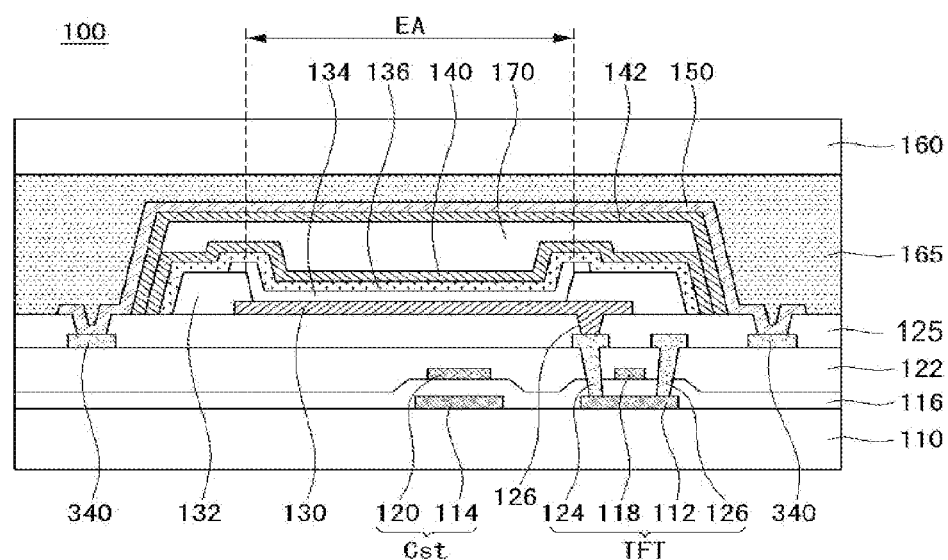

Referring to FIG. 12, the polymer layer 170 of the display device 100 according to a second embodiment can be formed in the overall area between the first passivation layer 140 and the second passivation layer 142. In other words, the polymer layer 170 entire covers the emission area EA and layers such as the organic emission layer 134. When the polymer layer 170 is formed on the emission area EA, lengths of effective infiltration paths of moisture and oxygen increase so as to prevent the organic emission layer 134 from being infiltrated by the moisture and oxygen and simplify a process of forming the polymer layer 170.

Figure 13:
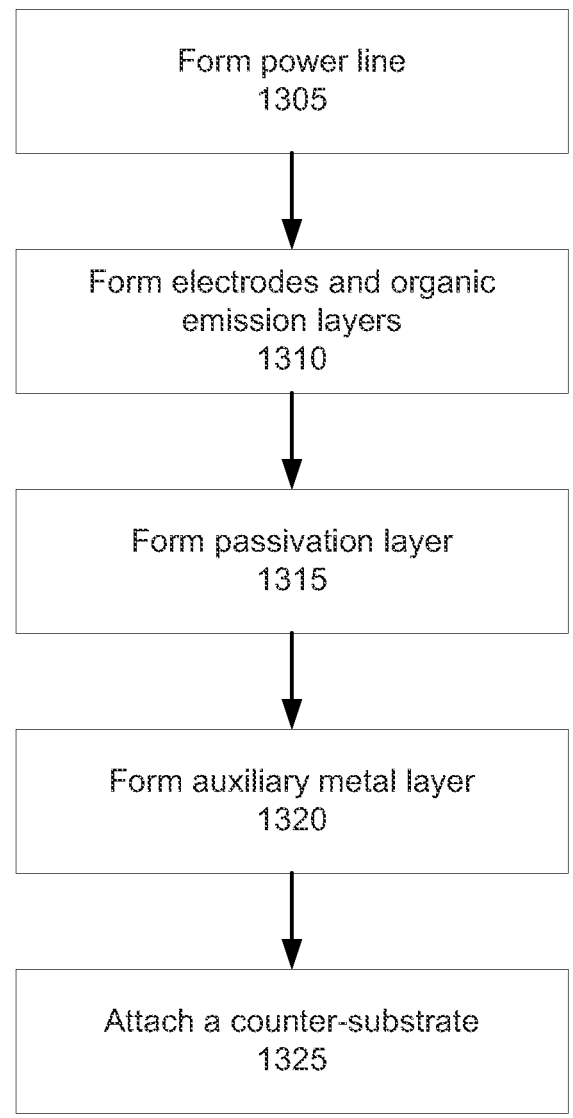
FIG. 13 is a flowchart illustrating a method of fabricating a display device, according to an embodiment.

Referring to FIG. 13, shown is a flowchart for a method of fabricating a display device 100, according to one embodiment. This method is generally applicable to any of the embodiments described in FIGS. 2-12. Generally, speaking, the process begins with a substrate 110, and each of the additional elements in the figures is formed sequentially starting with the elements closest to the substrate 110.

In step 1305, a power line 340 is formed over the substrate using processes well known in the art. The power line 340 may be formed in a TFT layer 127 that includes other components, such as TFTs and capacitors Cst.

In step 1310, the first electrode layer 130 is formed over the TFT layer 127 and substrate 110. The organic emission layer 134 is formed over the electrode 130. The second electrode 136 is formed over the organic emission layer 134. The layers formed in step 1310 may be formed so that the power line 127 is located around the layers and surrounds the layers on three sides, as shown in FIG. 2.

In step 1315, one or more passivation layers 140 or 142 are formed over the second electrode 136. In some embodiments, a polymer layer 170 is formed between two passivation layers 140 and 142, as shown in FIGS. 8 through 12. In step 1320, the auxiliary metal layer 150 is formed over the passivation layer 140 or 142. The auxiliary metal layer connects to the power line 340 and covers at least a portion of the passivation layer 140 or 142, second electrode 136, and/or pixel defining elements 132. The auxiliary metal layer 315 may be formed, for example, by depositing a layer of the metal onto the passivation layer 140 or 142.

In step 1325, a counter-substrate 160 is bonded to the already fabricated portions of the display device (e.g., the substrate 110, TFT layer 127, etc) to create the display device. The counter-substrate 160 can be bonded by covering the metal layer 150 with a sealant 165 and then attaching the counter-substrate to the sealant 165.

As described above, the display device according to the second embodiments can prevent poor contact of the common power line and the auxiliary metal layer by forming the auxiliary metal layer on the substrate on which the common power line is disposed to directly connect the common power line to the auxiliary metal layer, improve production yield by simplifying the auxiliary metal layer manufacturing process, and reduce the resistance of the common power line. In addition, at least one passivation layer and auxiliary metal layer can be formed on the second electrode to enhance encapsulation effect.

Moreover, it is possible to prevent infiltration of external moisture and oxygen by forming the polymer layer between the first passivation layer and the second passivation layer to fill a gap caused by particles.

The following Table 1 shows a reduction in the resistance of the common power line according to the thickness of the auxiliary metal layer in the display device according to the first embodiment of the present invention, shown in FIG. 4.

TABLE 1

| | Al auxiliary metal layer | | | |
|---|---|---|---|---|
| Thickness(Å) | 2500 | 2000 | 1500 | 1000 |
| Resistance reduction | 2.45 | 2.52 | 2.63 | 2.81 |

Referring to Table 1, it is shown that the resistance of the common power line is reduced by connecting the common power line to the auxiliary metal layer in the display device of the present invention. Particularly, it can be confirmed that the resistance of the common power line decreases as the thickness of the auxiliary metal layer increases.

The foregoing embodiments and advantages are merely exemplary and are not to be construed as limiting the disclosed embodiments. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and also equivalent structures. Moreover, unless the term "means" is explicitly recited in a limitation of the claims, such limitation is not intended to be interpreted under 35 USC 112(6).

What is claimed is:

1. A display device comprising:
   a common power line;
   a light emission layer interposed between a first and a second electrode;
   a passivation layer formed over the second electrode and having a stepped shape; and
   an auxiliary metal layer coupled to the common power line, at least a portion of the auxiliary metal layer formed over the passivation layer and having a shape that follows the stepped shape of the passivation layer.

2. The display device of claim 1, wherein the common power line is located around at least three sides of the second electrode.

3. The display device of claim 1, wherein the auxiliary metal layer is transparent to light emitted by the light emission layer.

4. The display device of claim 1, further comprising:
   another passivation layer formed over the auxiliary metal layer, the another passivation layer having a shape that follows the shape of the auxiliary metal layer.

5. The display device of claim 1, wherein an opening in the auxiliary metal layer overlaps with at least a portion of the light emission layer.

6. The display device of claim 1, further comprising:
   a polymer layer located between the auxiliary metal layer and the second electrode.

7. The display device of claim 6, further comprising:
   another passivation layer located between the polymer layer and the second electrode.

8. The display device of claim 6, wherein an opening in the polymer layer overlaps with at least a portion of the light emission layer.

9. The display device of claim 8, further comprising:
   another passivation layer formed over the auxiliary metal layer, the passivation layer having a shape that follows the shape of the auxiliary metal layer.

10. The display device of claim 8, wherein an opening in the auxiliary metal layer overlaps with at least a portion of the light emission layer.

11. The display device of claim 6, wherein the polymer layer entirely covers the light emission layer.

12. The display device of claim 1, wherein the first electrode and common power line are formed over a substrate, and further comprising:
    a sealant covering the auxiliary metal layer; and
    a counter-substrate attached to the sealant.

13. A method of fabricating a display device, comprising:
    forming a common power line;
    forming a first electrode;
    forming a light emission layer over the first electrode;
    forming a second electrode over the light emission layer;
    forming a passivation layer over the second electrode, the passivation layer having a stepped shape; and
    forming an auxiliary metal layer that is coupled to the common power line, at least a portion of the auxiliary metal layer formed over the passivation layer and having a shape that follows the stepped shape of the passivation layer.

14. The method of claim 13, wherein the common power line is formed to be located around at least three sides of the second electrode.

15. The method of claim 13, wherein the auxiliary metal layer is formed to be transparent to light emitted by the light emission layer.

16. The method of claim 13, further comprising:
    forming another passivation layer over the auxiliary metal layer, the another passivation layer having a shape that follows the shape of the auxiliary metal layer.

17. The method of claim 13, wherein the auxiliary metal layer is formed with an opening in the auxiliary metal layer that overlaps with at least a portion of the light emission layer.

18. The method of claim 13, further comprising:
    forming a polymer layer over the second electrode,
    wherein forming the passivation layer comprises forming the passivation layer over the polymer layer.

19. The method of claim 18, further comprising:
    forming another passivation layer over the second electrode,
    wherein forming the polymer layer comprises forming the polymer layer over the another passivation layer.

20. The method of claim 18, wherein the polymer layer is formed with an opening that overlaps with at least a portion of the light emission layer.

21. The method of claim 20, further comprising:
    forming another passivation layer over the auxiliary metal layer, the passivation layer having a shape that follows the shape of the auxiliary metal layer.

22. The method of claim 20, wherein the auxiliary metal layer is formed with an opening that overlaps with at least a portion of the light emission layer.

23. The method of claim 18, wherein the polymer layer is formed to entirely cover the light emission layer.

24. The method of claim 13, wherein the second electrode and power line are formed over a substrate, and further comprising:
    covering the auxiliary metal layer with a sealant; and
    attaching a counter-substrate to the sealant.

* * * * *